(12) United States Patent
Sampayan et al.

(10) Patent No.: US 11,888,023 B2
(45) Date of Patent: Jan. 30, 2024

(54) PARTIAL DISCHARGE SUPPRESSION IN HIGH VOLTAGE SOLID-STATE DEVICES

(71) Applicants: Lawrence Livermore National Security, LLC, Livermore, CA (US); Opcondys, Inc., Manteca, CA (US)

(72) Inventors: Stephen Sampayan, Manteca, CA (US); Kristin Cortella Sampayan, Manteca, CA (US)

(73) Assignees: Lawrence Livermore National Security, LLC, Livermore, CA (US); Opcondys, Inc., Manteca, CA (US)

( * ) Notice: Subject to any disclaimer, the term of this patent is extended or adjusted under 35 U.S.C. 154(b) by 0 days.

(21) Appl. No.: 18/150,000

(22) Filed: Jan. 4, 2023

(65) Prior Publication Data
US 2023/0145347 A1     May 11, 2023

Related U.S. Application Data

(63) Continuation of application No. 17/177,884, filed on Feb. 17, 2021, now Pat. No. 11,557,646.

(60) Provisional application No. 62/977,564, filed on Feb. 17, 2020.

(51) Int. Cl.
*H01L 29/06* (2006.01)
*H01L 21/762* (2006.01)

(52) U.S. Cl.
CPC ........ *H01L 29/0611* (2013.01); *H01L 21/762* (2013.01); *H01L 29/0649* (2013.01)

(58) Field of Classification Search
CPC ............. H01L 29/0611; H01L 29/0649; H01L 21/762; H01L 21/565; H01L 21/568; H01L 21/52; H01L 21/563; H01L 23/295; H01L 23/3135; H01L 23/3121; H01L 23/562; H01L 23/3142; H01L 23/552; H01L 23/3171; H01L 23/3185

See application file for complete search history.

(56) References Cited

U.S. PATENT DOCUMENTS

| | | | |
|---|---|---|---|
| 2010/0139752 A1 | 6/2010 | Fang | |
| 2018/0350780 A1* | 12/2018 | Fuergut | ................ H01L 23/295 |
| 2020/0098673 A1* | 3/2020 | Kawashima | ...... H01L 23/49562 |

OTHER PUBLICATIONS

International Search Report and Written Opinion issued in the International Application No. PCT/US21/18234, dated Jun. 23, 2021, 16 pages.

* cited by examiner

*Primary Examiner* — Calvin Y Choi
(74) *Attorney, Agent, or Firm* — Perkins Coie LLP (57) ABSTRACT

Devices, methods and techniques are disclosed to suppress electrical discharge and breakdown in insulating or encapsulation material(s) applied to solid-state devices. In one example aspect, a multi-layer encapsulation film includes a first layer of a first dielectric material and a second layer of a second dielectric material. An interface between the first layer and the second layer is configured to include molecular bonds to prevent charge carriers from crossing between the first layer and the second layer. The multi-layer encapsulation configuration is structured to allow an electrical contact and a substrate of the solid-state device to be at least partially surrounded by the multi-layer encapsulation configuration.

20 Claims, 7 Drawing Sheets

PARTIAL DISCHARGE SUPPRESSION IN HIGH VOLTAGE SOLID-STATE DEVICES

CROSS REFERENCE TO RELATED APPLICATIONS

This patent document in a continuation of and claims the benefit of priority to U.S. patent application Ser. No. 17/177,884, filed on Feb. 17, 2021, which further claims priority to and benefits of U.S. Provisional Patent Application No. 62/977,564 entitled "Partial Discharge Suppression in High Voltage Solid State Devices" and filed Feb. 17, 2020. The entire contents of the before-mentioned patent application are incorporated by reference as part of the disclosure of this patent document.

STATEMENT REGARDING FEDERALLY SPONSORED RESEARCH

The United States Government has rights in this invention pursuant to Contract No. DE/AR0000907 awarded by the Advanced Research Projects Agency-Energy by the United States Department of Energy and Contract No. DE-AC52-07NA27344 awarded by the United States Department of Energy.

TECHNICAL FIELD

This document generally relates to electrical insulation of solid-state devices with dielectric materials.

BACKGROUND

Solid-state devices are electronic devices in which electricity flows through solid crystals, such as silicon, gallium arsenide, or germanium. For example, a power solid-state semiconductor device is a semiconductor device used as a switch or rectifier in power electronics. Solid-state devices are found in a variety of systems delivering a few tens of milliwatts up to around a gigawatt in high-voltage transmission lines.

SUMMARY

Devices, methods and techniques are disclosed for suppressing electrical discharge and breakdown in insulating or encapsulation material(s) applied to solid-state devices.

In one example aspect, a solid-state device includes a substrate, a first electrical contact positioned on the substrate, and a multi-layer encapsulation film at least partially surrounding the first electrical contact and the substrate. The multi-layer encapsulation film comprises multiple layers of one or more dielectric materials. An interface between two adjacent layers of the multiple layers is configured to include molecular bonds to prevent charge carriers from crossing between the two adjacent layers.

In another example aspect, a first layer of a first dielectric material and a second layer of a second dielectric material. An interface between the first layer and the second layer is configured to include molecular bonds to prevent charge carriers from crossing between the first layer and the second layer. The multi-layer encapsulation configuration is structured to allow an electrical contact and a substrate of the solid-state device to be at least partially surrounded by the multi-layer encapsulation configuration.

The above and other aspects and features of the disclosed technology are described in greater detail in the drawings, the description and the claims.

DETAILED DESCRIPTION

Figure 1:
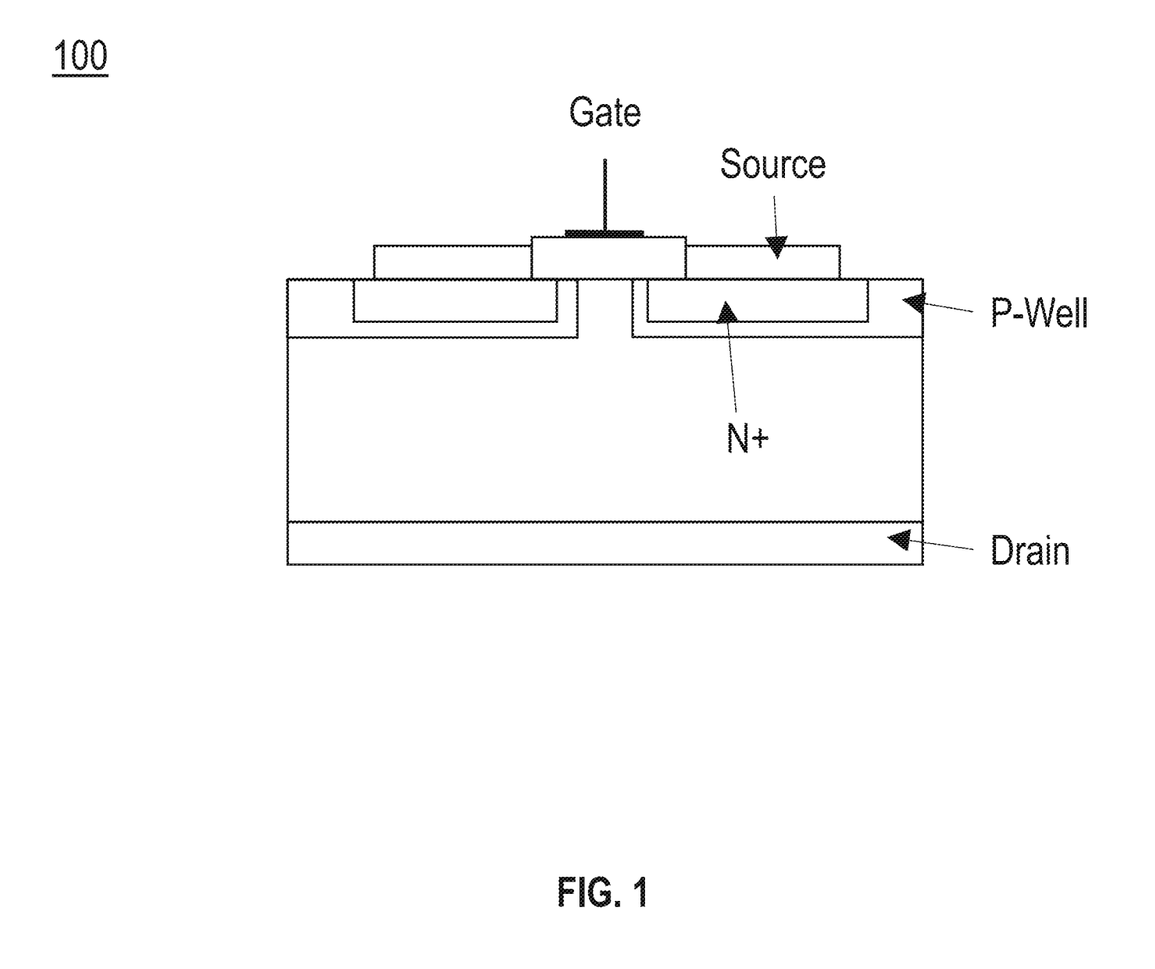
FIG. 1 illustrates an example Metal Oxide Semiconductor Field-Effect Transistor (MOSFET) device.

High-voltage solid-state devices exist for many different applications. They can be fabricated as single packaged discrete device or embedded in smart power structures to cover a huge voltage range. For example, two major device types—Metal Oxide Semiconductor Field-Effect Transistor (MOSFET) and Insulated-Gate Bipolar Transistor (IGBT)—are used for switching applications. FIG. 1 illustrates an example double-diffused MOSFET device 100.

Figure 2:
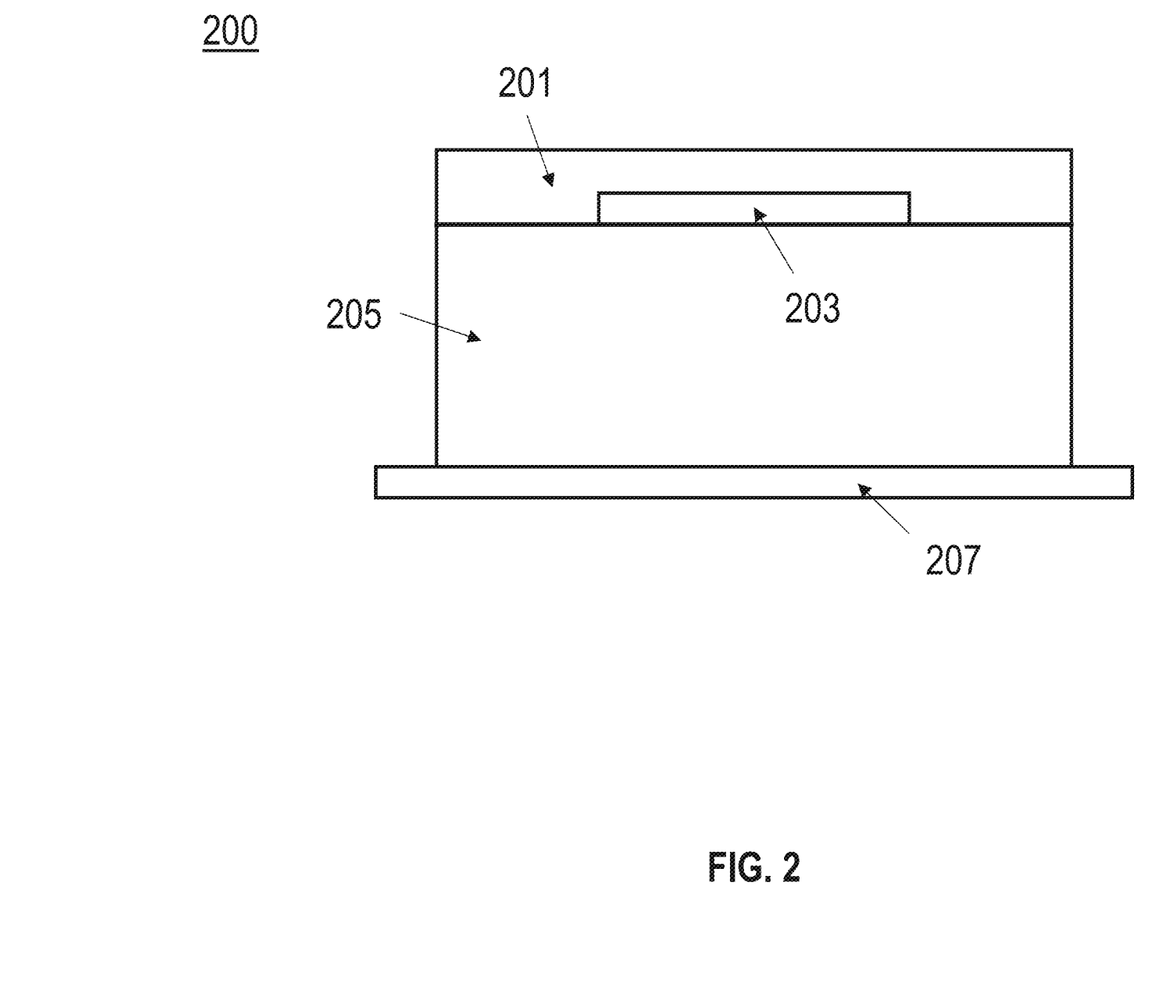
FIG. 2 illustrates an example use of full, continuous dielectric encapsulation around an electrode that is fixed to semiconducting crystalline material.

To realize the benefits of semiconductor materials, such as the wide band gap semiconductors, appropriate encapsulation materials should be used to ensure the electrical insulation during the operating period of the devices. FIG. 2 illustrates an example use of full, continuous dielectric encapsulation 201 around an electrode 203 that is fixed to semiconducting crystalline material 205. One of the limiting factors in the design of high-voltage semiconductor devices is the breakdown between electrodes of differing electrical potential. Once the breakdown occurs, organics are typically "carbonized" and result in lower resistive path that negates the capability of the device. In the case that organics are not used, a mechanical defect can result such as a puncture or material ablation so as to leave a physical trench that prevents adequate voltage hold-off, or a re-plating of conductive material such that the designed field distribution is perturbed. More subtle effects, such as partial discharge which occurs when ionization channels form but do not fully bridge two electrodes, can serve as the precursor to the breakdown if allowed to continue without suppression. The electric field between electrode 203 at high electrical potential and surrounding structures such as an electrode 207 at lower electrical potential can generate partial discharges in the encapsulation 201. These partial discharges can degrade the insulation, leading to an avalanche and catastrophic failure.

This patent document discloses techniques that can be implemented in various embodiments to suppress electrical discharge and breakdown in insulating or encapsulation material(s) applied to solid-state devices. Layered dielectric materials can be employed in a region or regions surrounding electrical contacts and semi-conducting/semi-insulating materials as a multi-layer encapsulation configuration to achieve the suppression.

All dielectric discharge phenomena start with free carrier injection. The injection can occur at an electrode interface or within the bulk apart from the electrodes. For instance, free carriers can be injected into the bulk volume at a metal-dielectric interface. These carriers can accumulate in the bulk without recombining, resulting in a charge imbalance and a modification of the local electric field. If these carriers gain sufficient energy from the applied electric field between collisions with molecules in the material and the energy exceeds the ionization energy of the molecules, a self-propagating and sustained discharge can begin. Because the channels that these local discharges can produce are small dimensionally, they further enhance the local electrical field so that the energy gained per unit length is increased significantly. At each of the collisions, additional charge carriers are released. If a single carrier liberates more than one carrier in one or more collisions, then a self-sustaining avalanche discharge grows while the external electric field is applied. The result is a catastrophic failure of the dielectric. If a single carrier liberates less than one carrier in one or more collisions, then the discharge is self-quenching and does not propagate.

The dielectric properties of polymeric materials depend on the chemical composition and structure of the polymer. Non-polar polymers with a symmetrical structure and covalent bonds are typically the best electrical insulators. At interfaces between surfaces (e.g., surface boundaries), there are molecular bonds that are distinct from those in the bulk materials. In many materials, the effect of the molecular bonds at the interface produces a surface energy that confines molecules and charge carriers in the bulk. Also, thinner materials can sustain a higher electric field than thicker materials. The scaling of the breakdown electric field is proportional to $t^{-0.5}$, where t represents the material thickness. Furthermore, the breakdown of a single layer behaves independently from the other layers in an ensemble of layers. Based on the above observations and understanding of breakdown phenomena, it is possible to provide a layered configuration of encapsulation material within a solid-state device to minimize the possibility of breakdown failure.

Figure 3:
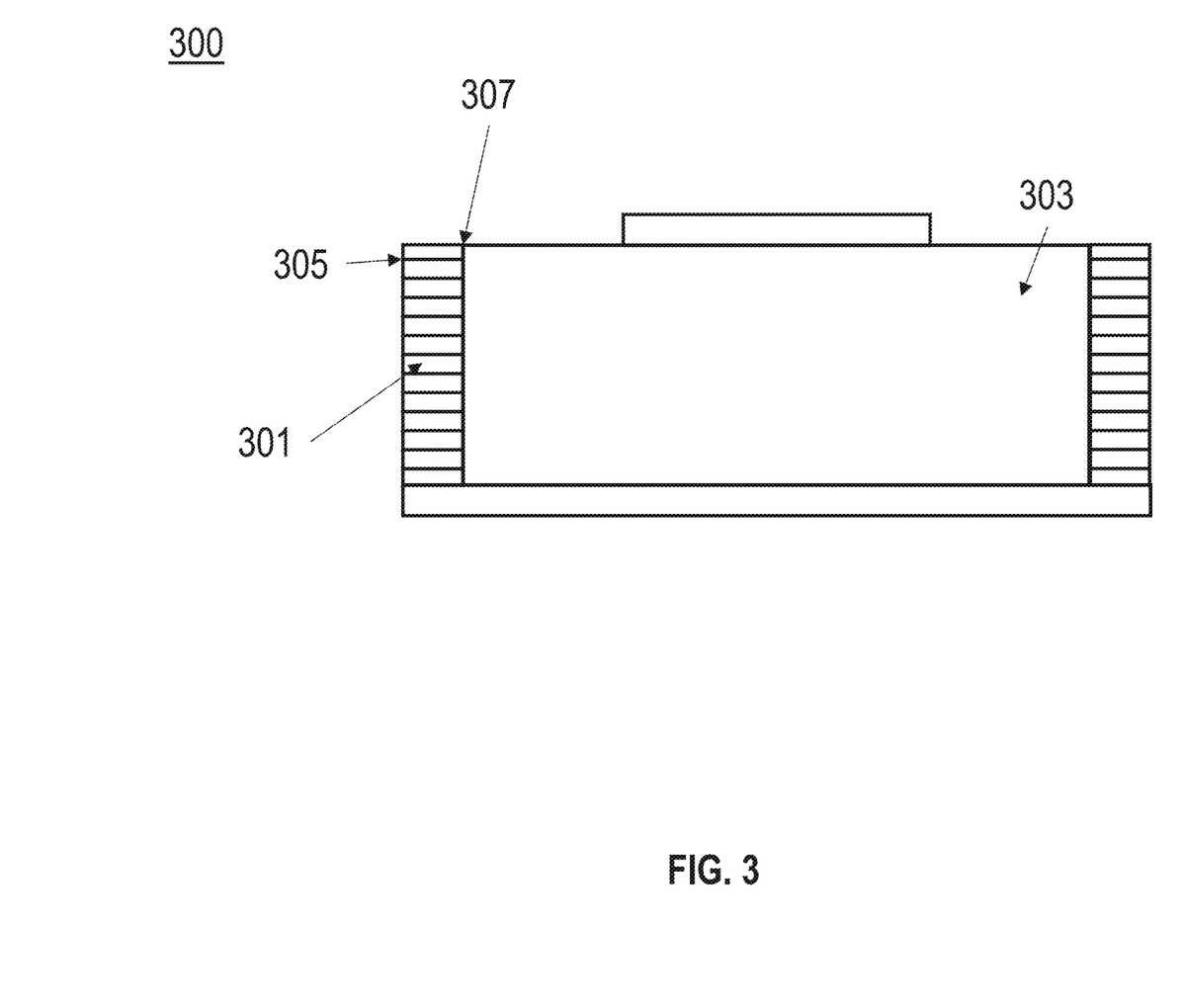
FIG. 3 illustrates an example use of a multilayer configuration for a photonically-activated control device.

A layered configuration has been used to achieve a high breakdown electric field. For example, FIG. 3 illustrates an example use of a multilayer configuration 301 for a photonically-activated control device 300. The multilayer configuration 301 is positioned around a crystalline material 303 such that the layer plane 305 intersects the edge 307 of the crystalline material in a substantially perpendicular manner. The multilayer configuration 301 enables the photonically-activated control device 300 to achieve a breakdown electric field as high as possible along the edge where electrodes are on the face.

To suppress partial electrical discharge, a layered configuration (e.g., a multiplayer polyimide film) can be disposed on top of and/or around the electrical contacts and/or the semiconductor materials. In particular, the layered configuration is suitable for junction solid-state devices that include separately doped semiconductor materials held in proximity to each other. Such junction devices require mitigation of partial discharges or breakdown in the bulk of the insulation or encapsulation around electrodes that have a high electrical potential relative to the surrounding environment.

Figure 4A:
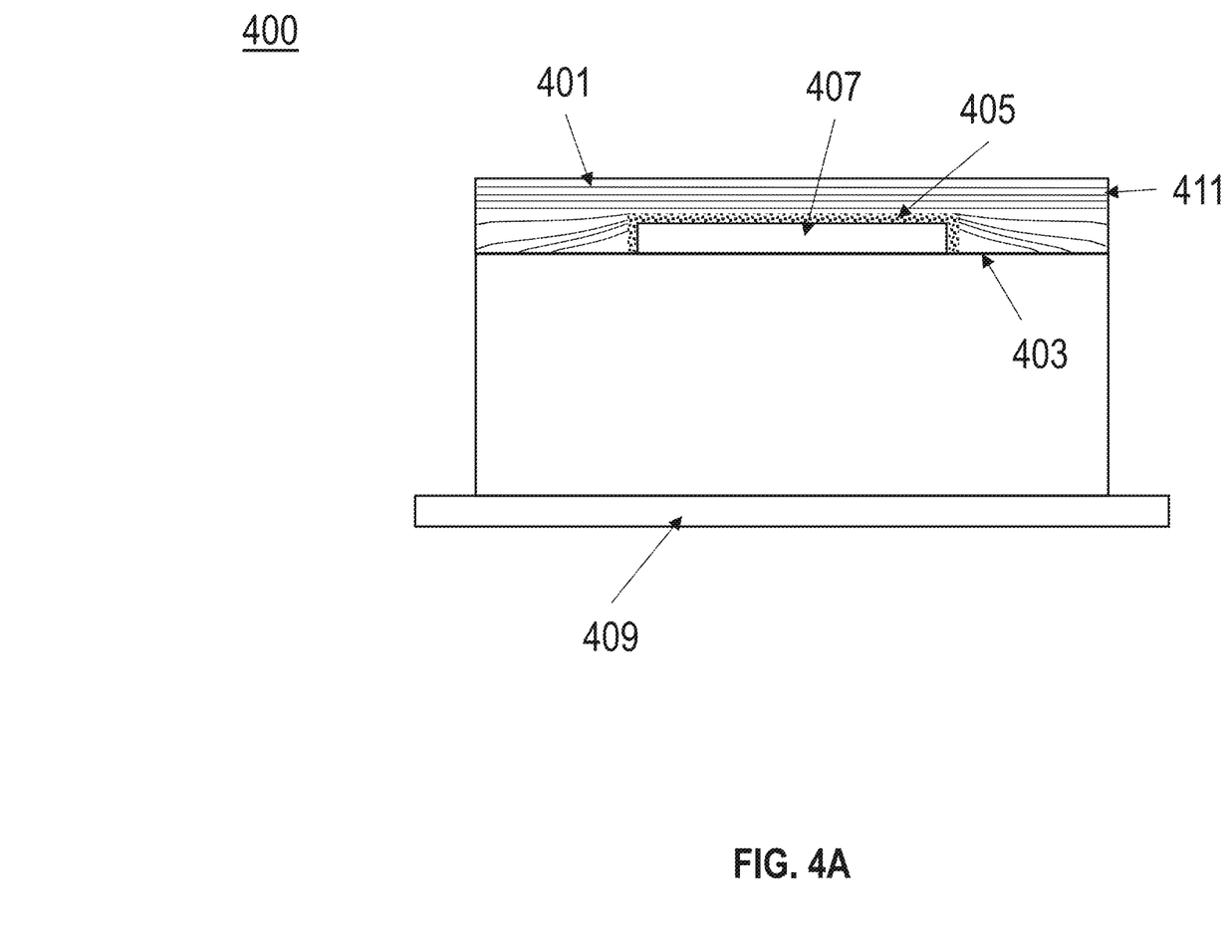
FIG. 4A illustrates an example multi-layer film of encapsulation material(s) for a junction device in accordance with the present technology.
Figure 4B:
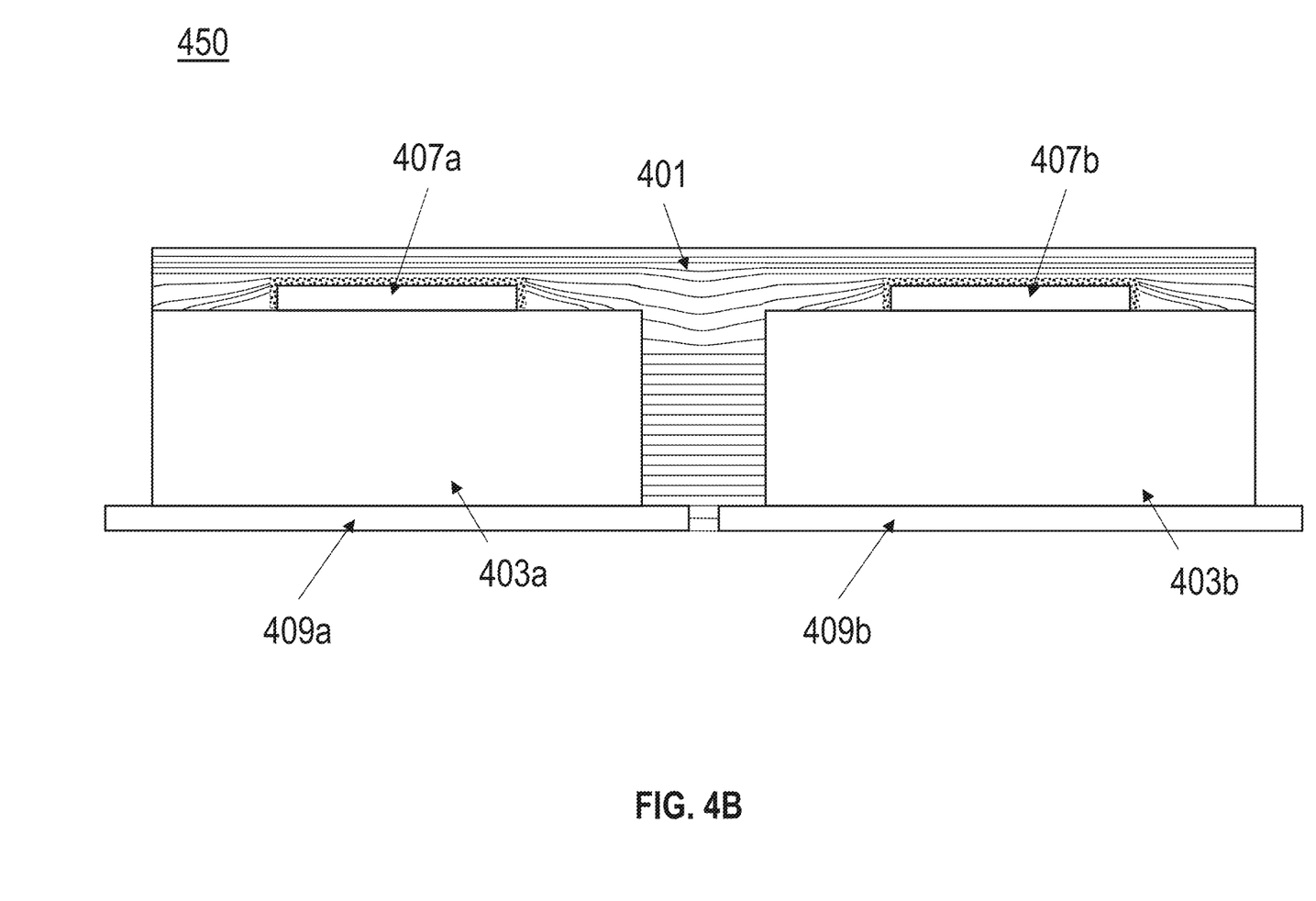
FIG. 4B illustrates another example multi-layer film of encapsulation material(s) for two junction devices in accordance with the present technology.

FIG. 4A illustrates an example multi-layer film 400 of encapsulation material(s) for a junction device in accordance with the present technology. As shown in FIG. 4A, multiple layers of the encapsulation material(s) 401 are disposed directly on the top surface of the substrate 403 and the electrode 407. FIG. 4B illustrates another example multi-layer film 450 of encapsulation material(s) for two junction devices in accordance with the present technology. As shown in FIG. 4B, multiple layers of the encapsulation material(s) 401 are disposed on top of and around the substrate 403 and the electrodes 407a, 407b. In this placement, the faces of the insulation layers are at or nearly perpendicular to the local electric field.

Partial discharges can be generated in the encapsulation around the electrode 407 (407a,b) as shown in FIGS. 4A-4B. These partial discharges can degrade the insulation so that an avalanche and catastrophic failure can occur. By layering the insulation material 401 on and/or around the electrode(s) 407 (407a,b), accelerated charge carriers in the bulk can be inhibited from crossing into the next layer due to the molecular bonds at the interfaces between any adjacent layers. Furthermore, as discussed above, thinner materials can sustain a higher electric field than thicker materials. A stack of individual layers that behaves independently from each other can withstand a much higher electric field as a whole.

Existing encapsulation materials, such as silica or resin, can be used to produce the encapsulation layers. For example, polyimide, epoxy resin, or silicone gel can be used to construct the multi-layer film as shown in FIGS. 4A-B.

In some cases, if resistive material is allowed to bridge from electrode 407 to a second electrode 409, the resistive material can adversely affect the operation of the device. In some embodiments, as shown in FIG. 4A, a thin semi-conductive material 405 can be provided as a coating between the electrode 407 and the multilayer film to prevent this bridging. In some embodiments, some provisions (e.g., masking) can be provided so that the semi-conductive coating is isolated to the region on and around electrode 307. Placing the semi-conductive coating 405 on the surface of the electrodes also prevents injected charge at the electrodes from accumulating in the bulk insulation.

In some embodiments, a semi-conductive material 411 can be placed between selected layers (e.g., layers that are disconnected from each other) to bridge the layers as well as to dissipate and equilibrate the injected charges. The use of the semi-conductive material 411 can be especially advantageous if the individual junction devices are arranged in a series configuration (e.g., as shown in FIG. 4B) to allow a much higher voltage capability than a single device.

The semi-conductive material 405 can be graphite mixed in a dielectric material, such as epoxy. In some embodiments, the semi-conductive material 405 can initially be in a liquid state that is applied to the electrode 407. The semi-conductive material 405 then solidifies to form a coating. In some embodiments, the semi-conductive material 405 can be dry conductive particles that are applied as a thin layer to the surface of the electrode 407. The multi-layer film is then formed on top of the semi-conductive material 405.

Figure 5:
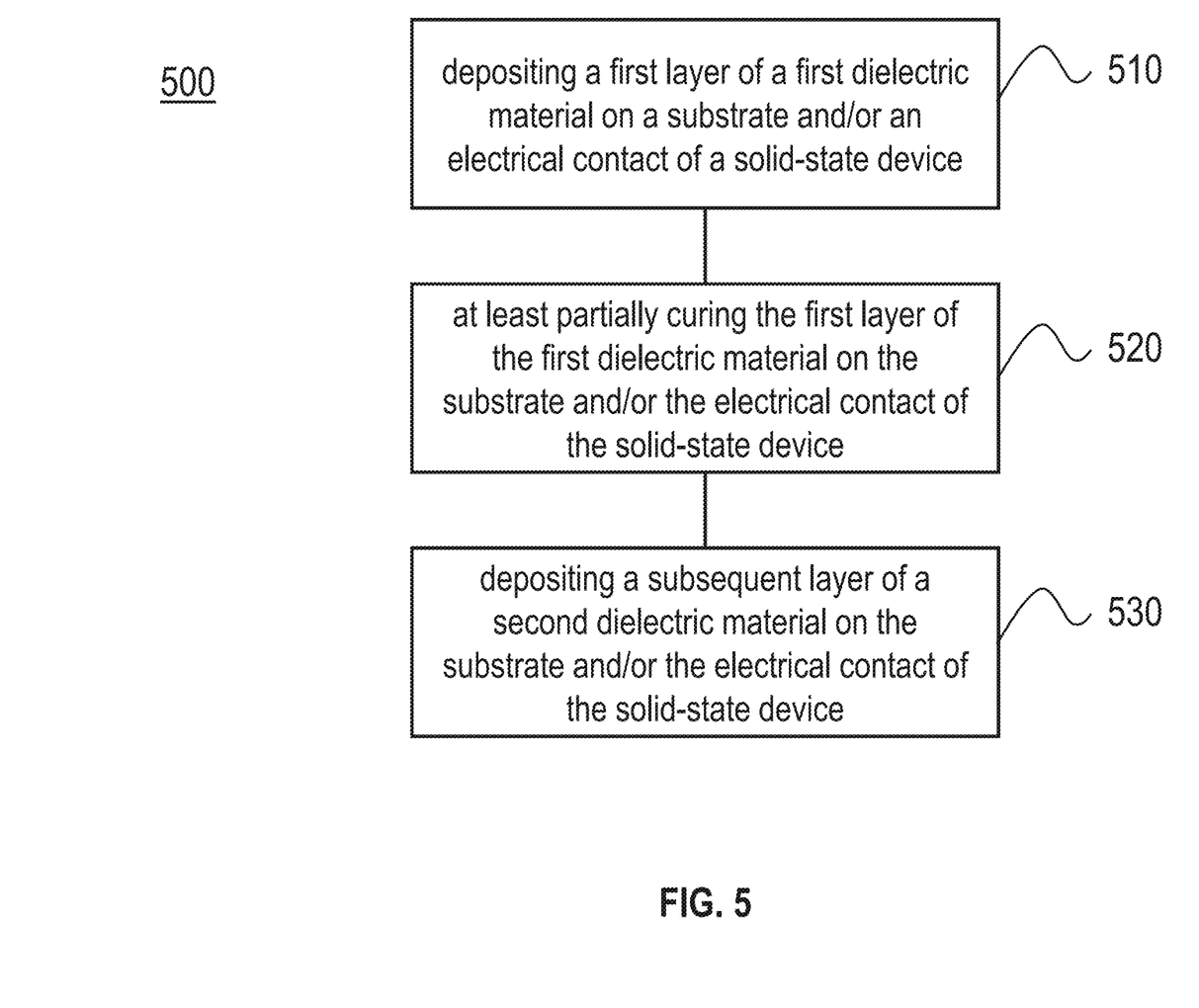
FIG. 5 is a flowchart representation of a method of forming a layered encapsulation configuration on a solid-state device in accordance with the present technology.

Forming these layers can be achieved by depositing layers of one or more dielectric materials on the substrate and/or the electrical contact. FIG. 5 is a flowchart representation of a method of forming a layered encapsulation configuration on a solid-state device in accordance with the present technology. The method 500 includes, at operation 510, depositing a first layer of a first dielectric material on the substrate and/or the electrical contact of the solid-state device. Before depositing the first layer, the first dielectric material is in a liquid form (e.g., by the use of a chemical solvent or a heating process). The first dielectric material is deposited onto the surface of the substrate and/or the electrical contact to achieve the desired thickness. In some embodiments, the thickness of each layer is smaller than 1 millimeter, or preferably smaller than 0.5 millimeter for certain applications.

The method 500 includes, at operation 520, at least partially curing the first layer of the first dielectric material on the substrate and/or the electrical contact of the solid-state device. The curing occurs as the chemical solvent evaporates or the heated material solidifies when it cools down. Depending on the properties of the first dielectric material, a partial cure or a full cure is used to form a surface boundary that can prevent the charge carriers from crossing the first layer.

The method 500 also includes, at operation 530, depositing a subsequent layer of a second dielectric material on the first layer such that the electric field vector is substantially perpendicular to the layer plane. In some embodiments, the second dielectric material is the same as the first dielectric material. For example, a first layer of polyimide can be formed on and/or around the substrate 403 and the electrode 407. Once the first layer of polyimide is cured or at least partially cured, a second layer of polyimide is applied on top of it. An interface is formed between the two layers to obtain distinct molecular bonds to prevent charge carriers from crossing the two layers. This process can be repeated to produce a suitable number of layers according to the operating voltage of the device.

In some embodiments, the second dielectric material can be different than the first dielectric material. For example, a two-part epoxy resin can be used to form the multi-layer encapsulation film. A first layer of epoxy resin is first formed on and/or around the substrate and the electrode. After the first layer is cured or at least partially cured, a second layer of epoxy resin can be applied on top of the first layer. Similarly, an interface is formed between the two layers of two different materials to obtain distinct molecular bonds. The process can be repeated to produce a suitable number of layers according to the operating voltage of the device.

In some embodiments, if non-polymer materials are used, an intermediate procedure can be implemented to ensure that the bonds at the interfaces do not reattach to the subsequent layer. The intermediate procedure can include chemical treatment or depositing a flash layer of dissimilar material.

Figure 6:
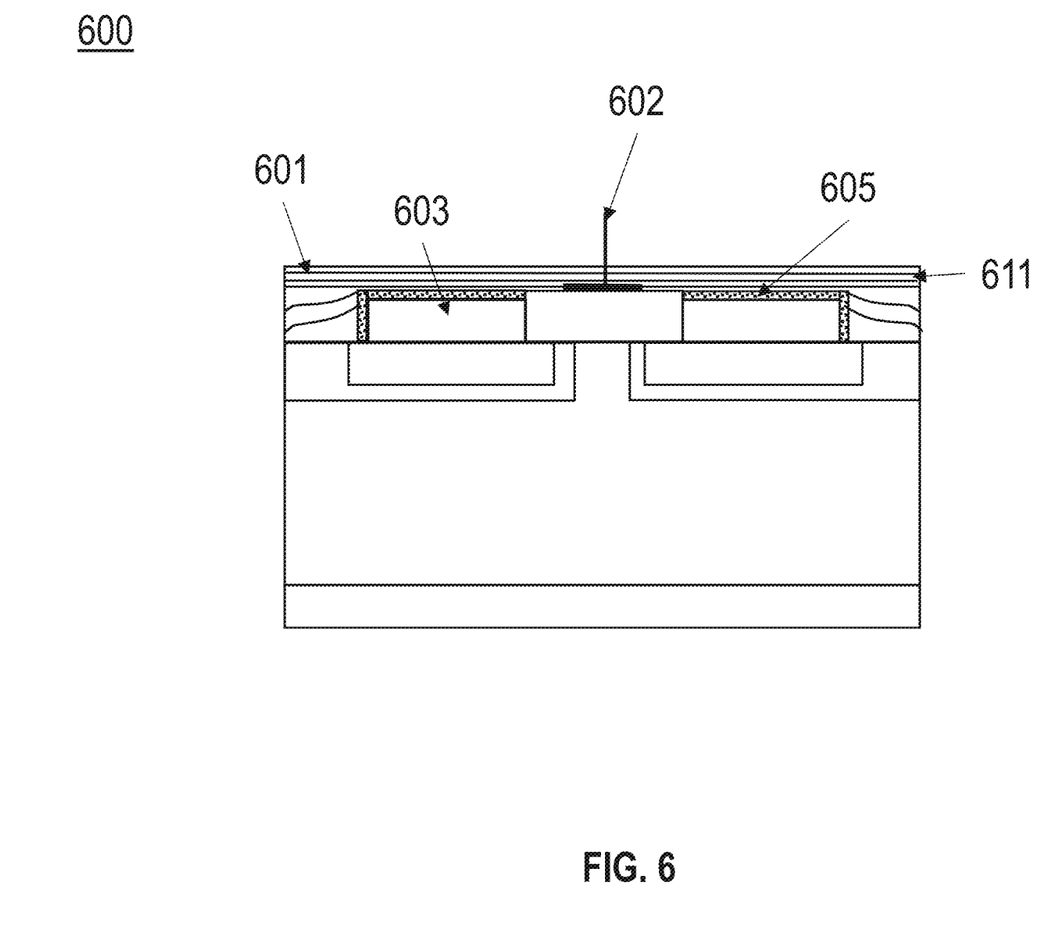
FIG. 6 shows an example multilayer encapsulation configuration implemented on a high-voltage MOSFET as shown in FIG. 1 in accordance with the present technology.

The manufacturing of the layered encapsulation configuration is dependent upon the properties of dielectric materials, whose strength per unit length increases with reduced material thickness. Layering dielectric material provides greater resistance to electrical discharge or breakdown for the same overall dielectric material thickness. FIG. 6 shows an example multilayer encapsulation configuration implemented on a high-voltage MOSFET as shown in FIG. 1 in accordance with the present technology. Dielectric material 601 is layered to provide insulation on and around the Gate 602 and Source 603 contacts. Accelerated charge carriers in one layer are inhibited from crossing into the next layer due to the molecular bonds at the layer interfaces. To further reduce the discharge effect, a semi-conductive material 611 can be placed between selected layers so as to bridge the layers, and to dissipate and equilibrate the injected charges. In some embodiments, placing a semi-conductive layer 605 on the surface of the Source 603 contacts also prevents injected charge from accumulating in the bulk insulation.

In one example aspect, a solid-state device is disclosed. The solid-state device includes a substrate, a first electrical contact positioned on the substrate, and a multi-layer encapsulation film at least partially surrounding the first electrical contact and the substrate. The multi-layer encapsulation film comprises multiple layers of one or more dielectric materials. An interface between two adjacent layers of the multiple layers is configured to include molecular bonds to prevent charge carriers from crossing between the two adjacent layers.

In some embodiments, the one or more dielectric materials comprise at least one of polyimide, epoxy resin, or silicone gel. In some embodiments, the multiple layers comprise the same dielectric material. In some embodiments, the multiple layers comprise different dielectric materials. In some embodiments, a thickness of each of the multiple layers is smaller than 1 millimeter. In some embodiments, a number of layers of the multiple layers in the multi-layer encapsulation is determined based on an operating voltage of the device.

In some embodiments, the device further includes a semi-conductive coating positioned between the first electrical contact and the multi-layer encapsulation film. In some embodiments, the multi-layer encapsulation film comprises a semi-conductive material positioned between two of the multiple layers. In some embodiments, the substrate comprises a wide band gap semiconductor material. In some embodiments, the substrate comprises separately doped semiconductor materials that form an electrical junction. In some embodiments, the solid-state device further comprises a second electrical contact that is at least partially surrounded by the multi-layer encapsulation film. The first electrical contact and the second electrical contact are arranged in a series configuration. In some embodiments, charge carriers in the substrate of the solid-state device are inhibited from crossing into a layer of the multiple layers due to the molecular bonds at an interface between the substrate and the layer.

In another example aspect, a multi-layer encapsulation configuration is disclosed. The multi-layer encapsulation configuration comprises a first layer of a first dielectric material and a second layer of a second dielectric material. An interface between the first layer and the second layer is configured to include molecular bonds to prevent charge carriers from crossing between the first layer and the second layer. The multi-layer encapsulation configuration is structured to allow an electrical contact and a substrate of the solid-state device to be at least partially surrounded by the multi-layer encapsulation configuration.

In some embodiments, the first dielectric material comprises at least one of polyimide, epoxy resin, or silicone gel. In some embodiments, the second dielectric material comprises at least one of polyimide, epoxy resin, or silicone gel. In some embodiments, the first dielectric material is same as the second dielectric material. In some embodiments, the first dielectric material is different than the second dielectric material.

In some embodiments, a thickness of the first layer or the second layer is smaller than 1 millimeter. In some embodiments, the multi-layer encapsulation configuration further includes a semi-conductive material positioned between the first layer and the second layer. In some embodiments, the multi-layer encapsulation configuration is implemented as part of the solid-state device. In some embodiments, the solid-state device comprises separately doped semiconductor materials that form an electrical junction. In some embodiments, the solid-state device comprises a wide band gap semiconductor material.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described, and other implementations, enhancements and variations can be made based on what is described and illustrated in this patent document.

What is claimed is:

1. An electronic device, comprising:
  a substrate;
  a first electrical contact positioned on the substrate; and
  a multi-layer encapsulation film surrounding at least a top surface of the first electrical contact and at least part of the substrate, wherein the multi-layer encapsulation film comprises multiple layers of one or more dielectric materials, wherein an interface between two adjacent layers of the multiple layers is configured to include molecular bonds to prevent charge carriers from crossing between the two adjacent layers.

2. The electronic device of claim 1, wherein the multi-layer encapsulation film is positioned around the substrate such that a plane of a layer of the multi-layer encapsulation film intersects an edge of the substrate in a substantially perpendicular manner.

3. The electronic device of claim 1, further comprising a second electrical contact that is at least partially surrounded by the multi-layer encapsulation film, wherein the first electrical contact and the second electrical contact are arranged in a series configuration.

4. The electronic device of claim 1, wherein the one or more dielectric materials comprise at least one of polyimide, epoxy resin, or silicone gel.

5. The electronic device of claim 1, further comprising a semi-conductive coating positioned between the first electrical contact and the multi-layer encapsulation film.

6. The electronic device of claim 5, wherein the semi-conductive coating comprises graphite mixed in a dielectric material.

7. The electronic device of claim 1, wherein the substrate comprises a wide band gap semiconductor material.

8. The electronic device of claim 1, wherein charge carriers in the substrate of the electronic device are inhibited from crossing into a layer of the multiple layers due to the molecular bonds at an interface between the substrate and the layer.

9. A multi-layer encapsulation configuration for use in an electronic device, comprising:
  a first layer of a first dielectric material, and
  a second layer of a second dielectric material, wherein an interface between the first layer and the second layer is configured to include molecular bonds to prevent charge carriers from crossing between the first layer and the second layer, and wherein the multi-layer encapsulation configuration is structured to allow at least a top surface of an electrical contact and at least part of a substrate of the electronic device to be surrounded by the multi-layer encapsulation configuration.

10. The multi-layer encapsulation configuration of claim 9, wherein a thickness of the first layer or the second layer is smaller than 1 millimeter.

11. The multi-layer encapsulation configuration of claim 9, wherein the multi-layer encapsulation configuration is structured to surround at least part of the substrate such that a plane of a layer of the multi-layer encapsulation configuration intersects an edge of substrate in a substantially perpendicular manner.

12. The multi-layer encapsulation configuration of claim 9, wherein the multi-layer encapsulation configuration is implemented as part of the electronic device that comprises the electrical contact and the substrate.

13. The multi-layer encapsulation configuration of claim 12, wherein the electronic device is a solid-state device that comprises separately doped semiconductor materials in proximity of each other that form an electrical junction.

14. The multi-layer encapsulation configuration of claim 12, wherein the electronic device further comprises a second electrical contact that is at least partially surrounded by the multi-layer encapsulation configuration, wherein the electrical contact and the second electrical contact are arranged in a series configuration.

15. A method for providing a multi-layer encapsulation configuration for use in an electronic device, comprising:
  depositing a first layer of a first dielectric material on an electrical contact of the electronic device, wherein the electrical contact is positioned on a substrate of the electronic device, and wherein the first layer surrounds at least a top surface of the electrical contact and at least part of the substrate;
  curing at least partially the first layer of the first dielectric material; and
  depositing a second layer of a second dielectric material on the first layer of the first dielectric material, wherein molecular bonds formed at an interface between the first layer and the second layer are configured to prevent charge carriers from crossing between the first layer and the second layer.

16. The method of claim 15, comprising:
  converting the first dielectric material into a liquid form using a chemical solvent or a heating process prior to the depositing of the first layer.

17. The method of claim 15, wherein the second dielectric material is different than the first dielectric material.

18. The method of claim 15, comprising:
  repeatedly depositing subsequent layers on the second layer, wherein a total number of layers in the multi-layer encapsulation configuration is determined based on an operating voltage of the electronic device.

19. The method of claim 15, wherein the first dielectric material comprises a non-polymer material, and wherein the method further comprises:

applying an intermediate procedure to the first layer, wherein the intermediate procedure comprises a chemical treatment or depositing a layer of material that is dissimilar to the first dielectric material.

20. The method of claim 15, wherein a thickness of the first layer or the second layer is smaller than 1 millimeter.

* * * * *